United States Patent
Wolf et al.

(10) Patent No.: US 9,401,601 B2
(45) Date of Patent: Jul. 26, 2016

(54) CIRCUIT DESIGNS FOR INDUCED TRANSIENT IMMUNITY

(71) Applicants: Eric A. Wolf, Norwood, MA (US); David L. Corkum, Attleboro, MA (US)

(72) Inventors: Eric A. Wolf, Norwood, MA (US); David L. Corkum, Attleboro, MA (US)

(73) Assignee: Sensata Technologies, Inc., Attleboro, MA (US)

(*) Notice: Subject to any disclaimer, the term of this patent is extended or adjusted under 35 U.S.C. 154(b) by 339 days.

(21) Appl. No.: 14/095,195

(22) Filed: Dec. 3, 2013

(65) Prior Publication Data
US 2015/0155705 A1 Jun. 4, 2015

(51) Int. Cl.
| | |
|---|---|
| *H02H 1/00* | (2006.01) |
| *H02H 1/04* | (2006.01) |
| *H02H 3/22* | (2006.01) |
| *H02H 9/06* | (2006.01) |
| *H02H 9/04* | (2006.01) |
| *G01L 19/00* | (2006.01) |
| *H03K 17/16* | (2006.01) |

(52) U.S. Cl.
CPC ............. *H02H 9/04* (2013.01); *G01L 19/00* (2013.01); *H03K 17/165* (2013.01)

(58) Field of Classification Search
CPC ............................. H02G 13/00; H02G 13/08
USPC .................................................. 361/87, 117
See application file for complete search history.

(56) References Cited

U.S. PATENT DOCUMENTS

| | | | |
|---|---|---|---|
| 2006/0042395 A1 | 3/2006 | Lepine et al. | |
| 2009/0121776 A1* | 5/2009 | Nagase | H04L 12/40182 327/434 |
| 2010/0052424 A1* | 3/2010 | Taylor | H01L 23/5223 307/45 |
| 2011/0148200 A1* | 6/2011 | Burns | H02M 1/32 307/43 |

OTHER PUBLICATIONS

"What the Designer Should Know Introduction to Automotive Linear Voltage Regulators", URL:https://www.infineon.com/dgdl/Introduction to Automotive Linear Voltage Regulators BR-2014.pdf, pp. 32, Jun. 22, 2015.
European Extended Search Report, Application No. EP 14 19 6145, pp. 7, dated Jun. 24, 2015.

\* cited by examiner

*Primary Examiner* — Dharti Patel
(74) *Attorney, Agent, or Firm* — Chapin IP Law, LLC

(57) ABSTRACT

A circuit for protecting a voltage supply to a sensor from a transient event is provided. The circuit includes at least one buffer capacitor configured to provide output during the transient event, the output substantially equivalent to output of a regulated supply during normal operation of the sensor. A method of fabrication and a sensor are disclosed.

8 Claims, 4 Drawing Sheets

US 9,401,601 B2

CIRCUIT DESIGNS FOR INDUCED TRANSIENT IMMUNITY

BACKGROUND OF THE INVENTION

1. Field of the Invention

This disclosure relates to design of an integrated circuit (IC), and in particular to designs for minimizing the effect of transient events on the operation of that IC.

2. Description of the Related Art

In some automotive sensor applications it required that the sensor is able to withstand exposure to a large negative voltage transient event. Withstand of this exposure typically means two things. First, the IC used in the sensor and all of its protective passive components must not be damaged during the exposure. Second, the sensor must recover from the exposure and output an accurate signal within a specified amount of time. Some applications are demanding reductions in the sensor recovery times.

Most modern ICs for automotive sensor applications contain both an analog core and a digital core. Failure to comply with recovery time requirements is usually dominated by the possibility of a reset of the digital core of the IC for IC recovery times greater than the required sensor recovery time requirement. The analog blocks of the IC typically recovers much more quickly than digital blocks. As a result, focus for the solution to this problem falls on maintaining critical digital core processes during a transient event to eliminate the possibility of digital reset.

Thus, what are needed are methods and apparatus to avoid an IC reset following a large negative capacitively coupled voltage pulse with respect to IC negative supply reference or a method to shorten the digital block recovery time. The concepts disclosed herein focus on the objective to avoid an IC reset following a large negative capacitively coupled voltage transient to the positive reference power supply node of an IC.

SUMMARY OF THE INVENTION

In one embodiment, a circuit for powering a pressure sensor is provided. The circuit is configured to provide stability in output of a regulated voltage supply during a negative voltage transient event in an external power supply. The circuit includes a regulated voltage supply configured to receive power from the external power supply and to supply power to the pressure sensor during the event and to prevent stored charge from flowing out of the regulated voltage supply to the external power supply.

In another embodiment, a circuit for a pressure sensor is disclosed. The circuit is configured for providing stability during a negative voltage transient event in an external power supply, and includes: a regulated voltage supply configured with at least one switch configured to substantially reduce electrical flow from the regulated voltage supply to selected digital circuits during the transient event and to provide power to the pressure sensor during the event.

In a further embodiment, a pressure sensor is disclosed. The pressure sensor includes a connection for connecting the sensor to an external power supply; and a regulated voltage supply for receiving power from the power supply and powering the sensor. The regulated voltage supply includes a circuit for providing stability during a negative voltage transient event in the external power supply, the circuit configured to supply power to the pressure sensor during the event and to prevent stored charge from flowing out of the regulated voltage supply to the external power supply.

BRIEF DESCRIPTION OF THE DRAWINGS

The features and advantages of the invention are apparent from the following description taken in conjunction with the accompanying drawings in which.

DETAILED DESCRIPTION OF THE INVENTION

Disclosed herein are methods and apparatus for improving responsiveness of an integrated circuit (IC) to a transient electrical event. Embodiments of the methods and apparatus are particularly useful in automotive sensing applications. In general, embodiments disclosed herein provide for improved protection of sensing components and reductions in recovery time resulting from a characteristic transient event.

As referred to herein, a "transient event" may include a direct capacitive coupling (DCC) electrical pulse that may cause perturbation in supplied voltage. In the example provided herein, the voltage is supplied to pressure sensor. Generally, supplied voltage ranges between about plus 85 V and about minus 85 V. However, a transient event may generally be characterized as a perturbation to an electrical input signal for the sensor. Accordingly, embodiments disclosed herein are not limited to management of response to plus 85 V or minus 85 V transient events, and may be well-suited to minimizing effects from other transient events.

Generally, transient events may come from any switched or pulsed device in an automobile. Often, wires for a particular sensor are bundled with wires for other components such as fuel injectors. Thus, a transient event may be initiated by configuration or operation of other nearby systems. In some embodiments, a transient event may be considered as a "slow" transient event, such as is defined by ISO 7637, pulse 2a. The duration of these pulses is generally about 50 microseconds (μs).

An integrated circuit that experiences a substantial transient event may experience a power-on-reset (POR) as a result. During a power-on-reset (POR), power to the integrated circuit is continuously applied, but the integrated circuit determines that there is insufficient power to guarantee correct operation. As a result, the integrated circuit will reset itself. Reset of the integrated circuit includes reinitializing all processes and performing startup checks to comprehensively ensure correct operation. During this process, the sensor does not output a signal that is representative of input conditions. Instead, the sensor may output a fault condition to provide for safe operation. Accordingly, during a power-on-reset (POR), the sensor does not provide any usable data.

Figure 1:
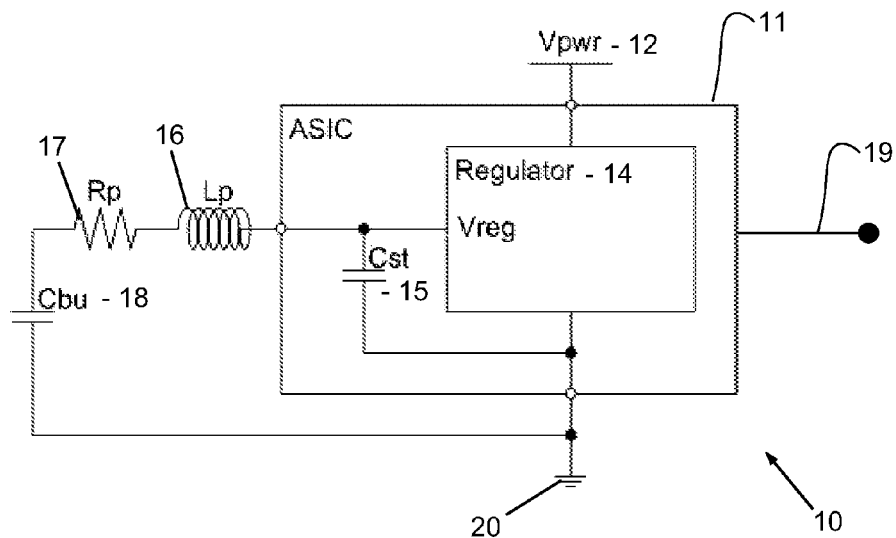
FIG. 1 is a schematic diagram depicting electrical aspects of an embodiment of a sensor according to the teachings herein.

Referring now to FIG. 1, there is shown a simplified schematic of aspects of a power and control system for a sensor 10. In this example, the sensor 10 includes an application specific integrated circuit 11 (ASIC, or IC). The IC 11 is powered by an external power supply 12. The external power supply 12 provides power to a regulated power supply 14. The regulated power supply 14 is grounded at electrical ground 20. In this example, the regulated power supply 14 also referred to as an "regulated supply") powers stabilizing capacitor 15 ($C_{ST}$) and also powers buffer capacitor 18 ($C_{BU}$). Included in the simplified diagram are parasitic inductance 16 (Lp) and parasitic resistance 17 (Rp) would to represent inductive and resistive properties of the circuit. The IC 11 provides an output 19 from the sensor 10.

It should be recognized that some of the other components of the sensor 10 are not shown. For example, sensor components such as a transducer are not shown, but generally considered as a part of the sensor 10. Merely for purposes of discussion herein, aspects of the sensor 10 generally shown and discussed herein include components for powering the sensor 10 and controlling the power systems of the sensor 10. It should be noted that the control components discussed herein, such as the IC 11, may serve multiple purposes and are not limited to controlling powering of the sensor 10. For example, the IC 11 may additionally receive data from sensing components and provide output data to the output 19.

All alternating current (AC) amplifiers have gain and phase characteristics that vary with frequency. As frequency increases, gain decreases and phase margin decreases. However, it is important for stability of an amplifier that the gain is reduced sufficiently prior to loss of the phase margin to avoid oscillation. Accordingly, the stabilization capacitor 15 ($C_{ST}$) provides the required attenuation of the gain at high frequency. Good stabilization capacitors 15 ($C_{ST}$) will have a very low parasitic inductance and generally have a small value of capacitance (relative to the buffer capacitor 18 ($C_{BU}$)). In order to maintain low parasitic inductance, ratings for the stabilization capacitor 15 ($C_{ST}$) as well as physical placement within the sensor 10 is carefully considered in design. Properly designing to these considerations enables a very fast response time for the capacitor.

An important design consideration when providing the buffer capacitor 18 ($C_{BU}$) is capability of the capacitor to store charge. A good buffer capacitor 18 ($C_{BU}$) would have a large capacitance. Where the sensor 10 is used in automotive applications, the transients in question are quite slow compared to the frequencies in consideration for amplifier stability. Accordingly, design of the sensor 10 is not constrained by requirements for low parasitic inductance.

A small amount of capacitance is included in the IC 11 to provide the stabilization function (fast response time). Use of the buffer capacitor 18 ($C_{BU}$) externally in parallel to the internal stabilization capacitor 15 ($C_{ST}$) reduces the gain bandwidth of the amplifier, to an acceptable level for operation of the sensor 10. Generally, the parasitic inductance 16 ($L_p$) and the parasitic resistance 17 ($R_p$) are a function of the PCB traces, solder joints, and wirebonds between the ASIC 11 and the buffer capacitor 18 ($C_{BU}$).

Figure 2:
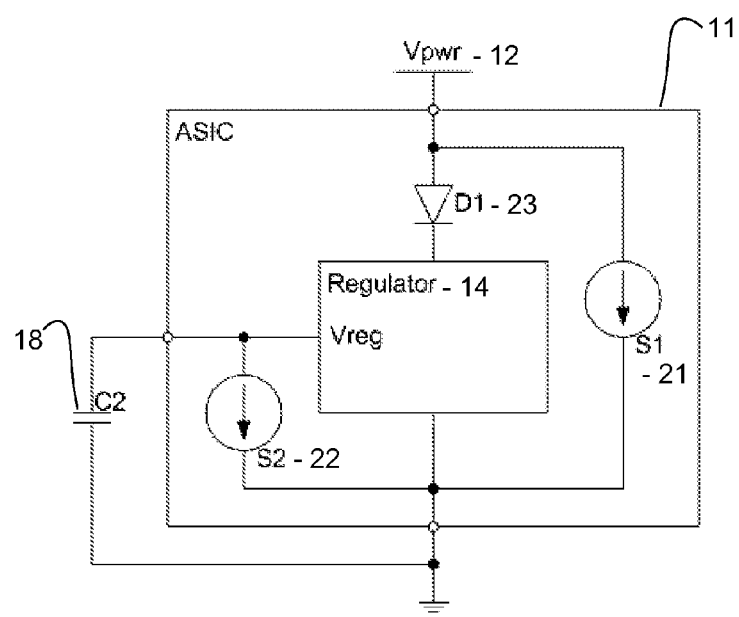
FIG. 2 is a schematic diagram depicting electrical aspects of an integrated circuit implemented within an exemplary sensor.

Referring to FIG. 2, there is shown an exemplary embodiment of the integrated circuit 11 (IC). Generally, transient events of the nature that may be experienced by the sensor 10 have a low frequency harmonic content. Accordingly, for some low-frequency embodiments, aspects of the integrated circuit 11 (IC) may be described by the schematic in FIG. 2.

In this example, the integrated circuit 11 (IC) is provided power from the power supply 12. The integrated circuit 11 (IC) includes regulated supply 14, a first electrical load 21 ($S_1$) and a second electrical load 22 ($S_2$), as well as buffer capacitor 18 (shown as $C_2$) and a diode 23 ($D_1$). In normal operation, current output of the regulated supply 14 matches current consumed by electrical the second load 22 ($S_2$). During a negative transient event, the regulated supply 14 stops receiving power, so it stops outputting current. Buffer capacitor 18 ($C_2$) will then supply needed current. The diode 23 ($D_1$) ensures charge from the buffer capacitor 18 ($C_2$) does not enter the power supply 12 or the first electrical load 21.

Aspects of the design provide for immunity of the sensor from transient events. Among other things, design provides for decreasing the slope of voltage decay. Various techniques may be used to decrease the slope of voltage decay. For example, stored charge may be increased (rating of the buffer capacitor 18 may be increased); charge consumption may be decreased (non-essential load circuits may be selectively turned off); and a rectifier such as the diode 23 ($D_1$) may be incorporated to avoid "backflow" of charge from regulator storage to the power supply 12.

A further aspect of the design calls for attenuating effects of a transient event on the power supply 12. This may be accomplished, for example, by decreasing time to return for the power supply 12.

Figure 3:
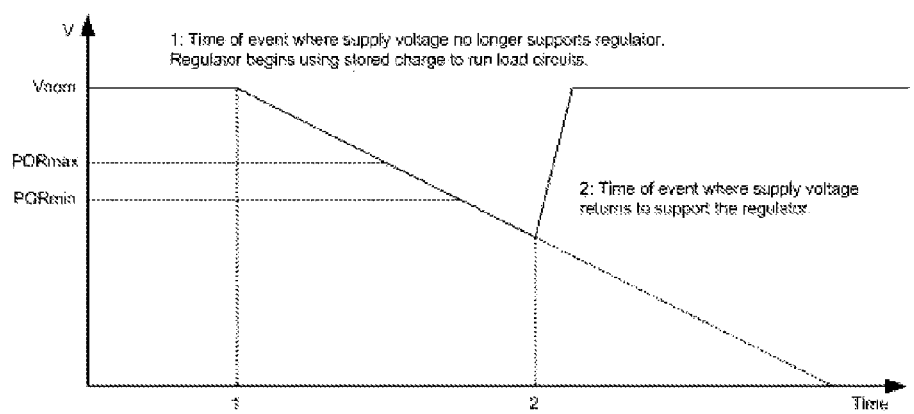
FIG. 3 is a graph depicting a relationship of voltage quantities during a transient event.

FIG. 3 is a graph depicting voltage of a regulated supply 14 for the integrated circuit 11 (IC). The graph depicts output in response to a negative voltage transient event.

In order to limit the effect of a transient event, additional design strategies may include increasing nominal voltage ($V_{nom}$); decreasing the minimum voltage for power-on-reset ($POR_{min}$); and, decreasing the maximum voltage for power-on-reset ($POR_{max}$). Generally, decreasing the minimum voltage for power-on-reset ($POR_{min}$) also decreases $POR_{max}$, assuming there is an equivalent part-to-part variance. Note that decreasing the minimum voltage for power-on-reset ($POR_{min}$) is generally limited by minimum safe voltage for correct load operation. Additionally, decreasing the maximum voltage for power-on-reset ($POR_{max}$) generally reduces part-to-part variance.

Figure 4:
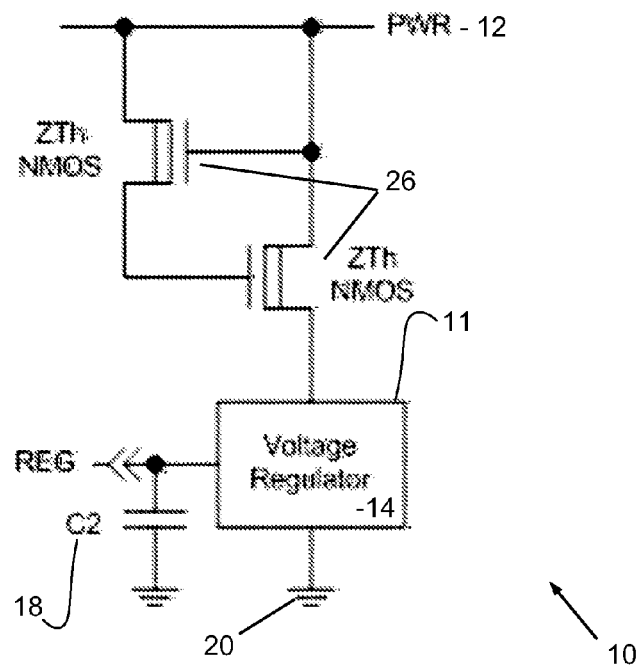
FIG. 4 is schematic diagram depicting aspects of another exemplary embodiment of an dampening circuit for dampening transient events.

FIG. 4 depicts another embodiment of a portion of the sensor 10 (that is, a power structure for powering the sensor 10). In this embodiment, the sensor 10 includes buffer capacitor 18 that includes a large capacitance ($C_2$) on output of the regulated supply 14. The buffer capacitor 18 may be at least one of internal and external to the integrated circuit 11 (IC). To further dampen the effects of a transient event, a current limiting feature is added between the buffer capacitor 18 ($C_2$) and the power supply 12. At least one zero threshold ($Z_{Th}$) pass-gate 26 transistor is included in the current path. In this example, the pass-gate 26 includes N-type metal-oxide-semiconductor (NMOS) logic that uses n-type metal-oxide-semiconductor field effect transistors (MOSFETs) to implement the pass-gate. Generally, NMOS transistors have four modes of operation: cut-off (or sub-threshold), triode, saturation (sometimes called active), and velocity saturation.

The pass-gate 26 can be configured to reduce the allowed current that can flow from the buffer capacitor 18 to the power supply 12 during a transient event. When using both a buffer capacitor 18 and pass-gate 26, the effect of the transient on the regulated supply 12 may be efficiently damped within desired specifications. This embodiment has a secondary benefit of allowing design control of in-rush of current to the buffer capacitor 18 during startup of the integrated circuit (IC) 11 through proper sizing of the $Z_{Th}$ MOSFETs.

Figure 5:
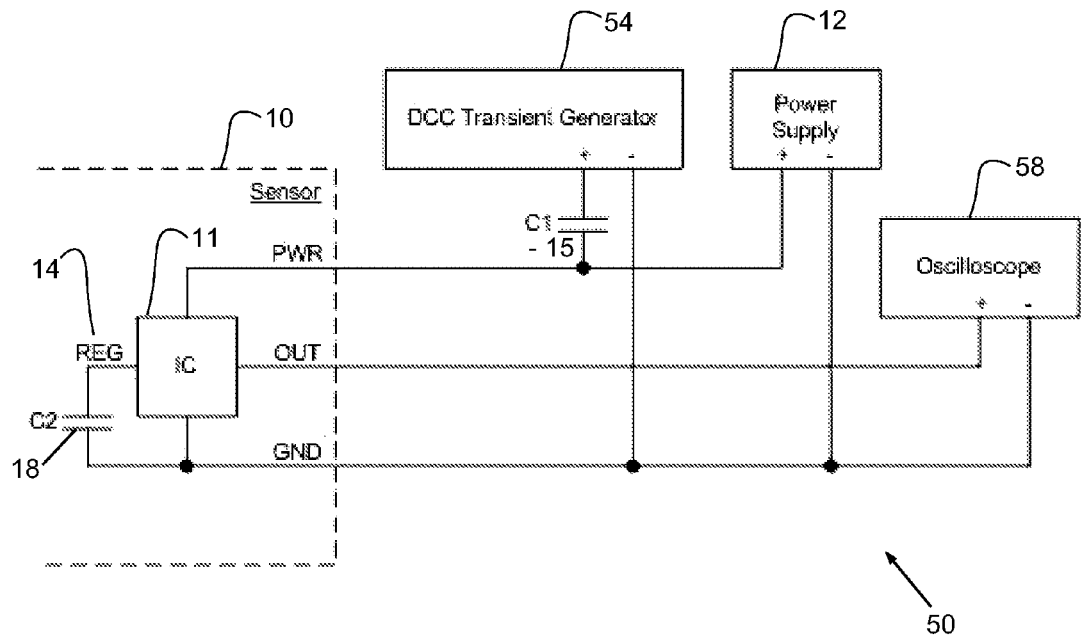
FIG. 5 is a schematic diagram depicting an exemplary embodiment of a test circuit for evaluating transient events.

Referring to FIG. 5, an exemplary test circuit 50 is shown. In the exemplary test circuit 50, direct capacitor coupling (DCC) transient events are coupled differentially with respect to ground through a stabilizing capacitor ($C_1$) 15 to the sensor power supply 12 on a line side (PWR). When the transient is applied, the voltage level supplied to the sensor 10 drops during the transient event. Generally, the integrated circuit 11 is powered by regulated supply 14 within the integrated circuit 11. The regulated supply 14 relies on output of the power supply 12 to be within a specific range in order to function properly. However, transient pulses disturb operation of the regulated supply 14, causing voltage of the regulated supply 14 to fall to a level that is below the reset limit. When this occurs, the integrated circuit 11 will undergo a power-on-reset.

As noted above, voltage from the regulated supply 14 is linked to (at least partially dependent upon) voltage of the external power supply 12. The regulated supply 14 cannot supply a voltage higher than voltage provided to it by the external power supply 12. As a result, voltage from the regulated supply 14 (referred to herein as "regulated voltage") provided is a minimum of the voltage from the regulated supply 14 or the external power supply 12. However, techniques can be applied to the design of the integrated circuit 11 to dampen effect of a transient event on the regulated supply 14.

It should be noted that circuitry similar to the test circuit 50 may be used operation of the sensor 10. In common embodiments, the sensor 10 is implemented with a buffer capacitor 18 ($C_2$). That is, in some embodiments of implementations of the sensor 10, a capacitor that is placed in series with the regulated supply 14 is used to stabilize output of the regulated supply 14. By using a buffer capacitor 18 ($C_2$) output of the regulated supply 14 is stabilized by providing bulk charge storage such that the sensor 10 is substantially immunized from transient events. Stated another way, a much larger current is required to degrade voltage from the regulated supply 14 in a manner that causes a power-on-reset.

As depicted in FIG. 5, the test circuit 50 includes a sensor 10 which is to be tested. Other components, such as power supply 12, may be used with the sensor 10 during normal operation. The test circuit 50 is useful for comparison of a variety of embodiments of sensors. Accordingly, the test circuit 50 may be configured appropriately for testing of various embodiments of sensors 10, including direct sensors 10 provided according to the teachings herein.

In this example, the exemplary test circuit 50 includes a transient generator 54, a power supply 12, and a readout device such as an oscilloscope 58. Generally, the transient generator 54 is configured to provide direct capacitor coupling (DCC) transient events. The power supply 12 is configured to provide appropriate power for powering the sensor 10. The sensor 10 includes an integrated circuit 11 (IC), which also may be referred to as an "application-specific integrated circuit (ASIC). The integrated circuit 11 (IC) includes an on-board regulated supply 14, and may include at least one of an analog core and a digital core. The oscilloscope 58 may be configured for monitoring and output of the sensor 10 and detecting response of the sensor 10 to transient events. The transient generator 54 may include at least one stabilizing capacitor 15 ($C_1$). The sensor 10 may include at least one buffer capacitor 18 ($C_2$).

Generally, the transient generator 54 is provided as off-the-shelf hardware configured to generate transient pulses according to desired characteristics such as an applicable standard for transient waveforms. An exemplary standard includes ISO 7637 pulse 2a. In order to better define relationships and dynamics within the circuit, reference may be had to FIG. 6.

Figure 6:
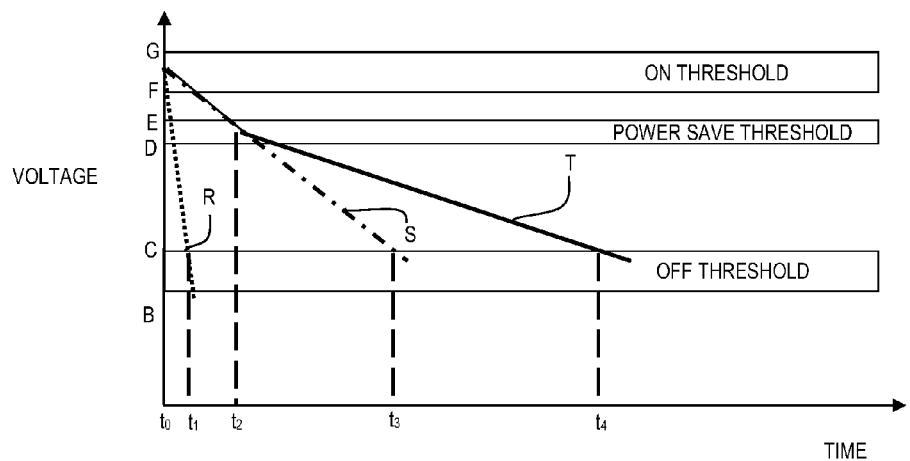
FIG. 6 is another graph depicting a relationship of voltage quantities during a transient event.

FIG. 6 depicts the voltage of a digital supply of an exemplary integrated circuit (IC) following a negative transient applied to the positive supply reference of the integrated circuit (IC) at time $t_0$. While the actual voltage levels versus time are usually slightly non-linear, the linear simplification is acceptable for explanation purposes. Similarly, the recovery (i.e., increase) of the digital supply voltage is not shown in FIG. 6. Voltage level B reflects the minimum value of a reset or OFF threshold of the IC. Designers usually set voltage level B slightly above the lowest value at which all digital circuit operation is maintained in a valid operating state over all tolerances. Voltage level C reflects the maximum value of the reset or off threshold of the IC. Voltage level F reflects the lowest possible ON threshold of the IC. Voltage level G reflects the largest possible ON threshold of the IC. Voltage level D reflects the lowest value at which the IC turns-off current flow to circuits that can be subsequently powered in the proper operation state without a reset of the integrated circuit. Voltage level E reflects the largest value at which the IC turns-off current flow to circuits that can be subsequently powered in the proper operation state without a reset of the integrated circuit. Line R reflects a digital voltage supply value versus time for a design that does not prevent current flow from the digital supply buffer capacitor through the digital voltage regulator (i.e., back flow) or to analog circuits. Line S reflects a digital voltage supply value versus time for a design that does prevent current flow from the digital supply buffer capacitor through the digital voltage regulator (i.e., back flow) or to analog circuits. Line T reflects a digital voltage supply value versus time for a design that does prevent current flow from the digital supply buffer capacitor through the digital voltage regulator (i.e., back flow) or to analog circuits and turns off current flow to selected digital blocks for a digital supply voltages below a "power saving" threshold. The necessity to implement designs related to line S or line T depends on the time to initiate voltage recovery of the digital supply voltage of the integrated circuit to ensure the digital supply voltage does not fall below the OFF threshold before voltage recovery begins.

Figure 7:
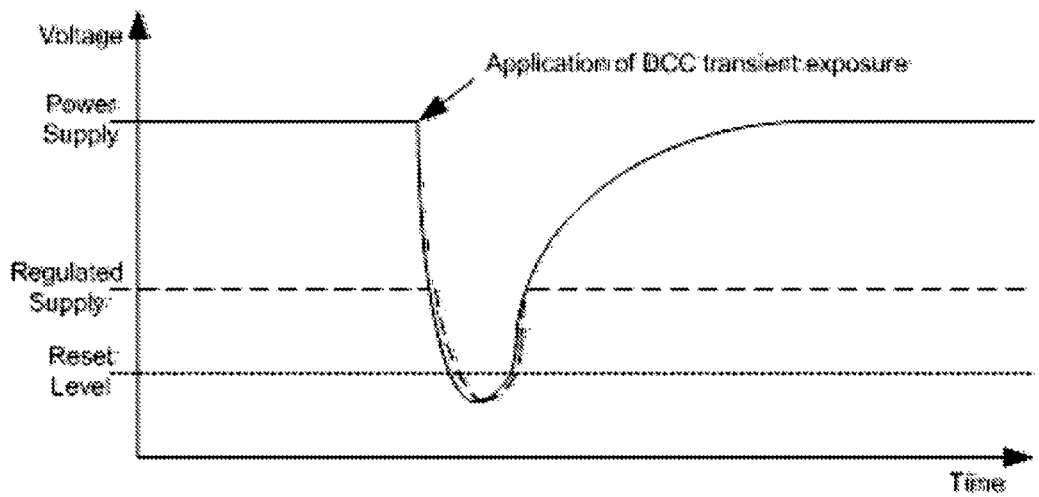
FIG. 7 is a graph depicting performance of a regulated power supply for a prior art sensor when subjected to a transient event.
Figure 8:
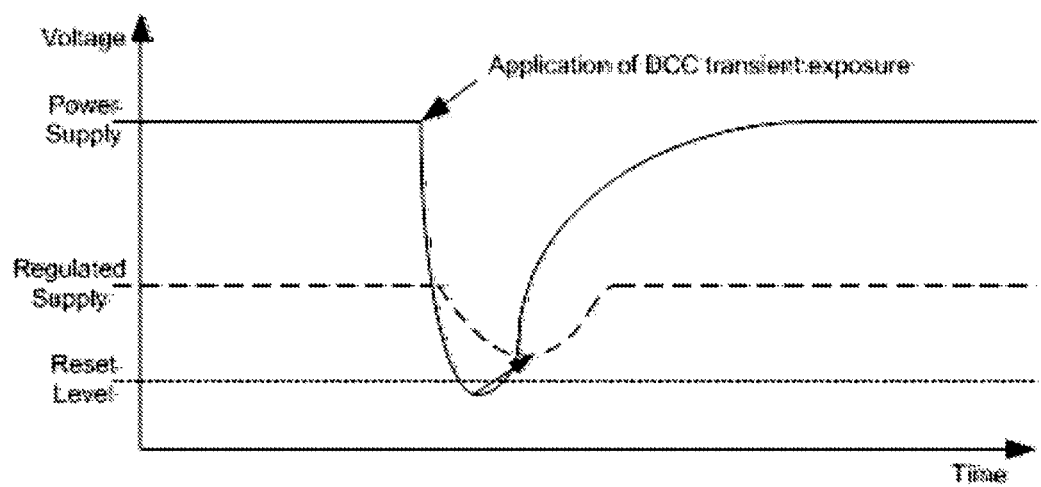
FIG. 8 is a graph depicting performance of a regulated power supply for a sensor according to the teachings herein when subjected to a transient event of the magnitude applied to the sensor of FIG. 7.

FIGS. 7 and 8 depict exemplary output of the test circuit 50. FIG. 7 depicts exemplary output of a prior art sensor; while FIG. 8 depicts exemplary output of a sensor 10 according to the teachings herein. In both examples, output of the regulated supply 14 is shown as a dashed line. In the case of the sensor 10 according to the teachings herein, output of the regulated supply 14 remains above a threshold power-on-reset level.

Generally, the components disclosed herein that provide for immunity of the sensor to the effects of transient events may be referred to collectively as a "protection circuit" and by other similar terms. In general, by incorporating at least one buffer capacitor 18 of a substantial rating, the protection circuit is configured to provide output during a transient event that is substantially equivalent to output of the regulated supply 14 during normal operation of the sensor 10. In some embodiments, duration of output of the buffer capacitor 18 is at least as long as duration of a single transient event. However, in some other embodiments, duration of output of the buffer capacitor 18 may be substantially longer than duration for any one transient event. Accordingly, the buffer capacitor 18 may be configured such that the sensor 10 may be protected from a number of transient events that occur in rapid succession.

In general, the sensor 10 may include any form of sensing circuitry and components desired to provide for a sensing application. The sensor may be configured for specialized applications. For example, the sensor may be configured for automotive applications. Accordingly, electrical properties of the protection circuit, sensing circuitry, the power supply and such may be configured according to the needs of an automobile designer, manufacturer or other similarly interested party. Exemplary automotive sensors include sensors for sensing at least one of pressure and temperature.

Various other components may be included and called upon for providing for aspects of the teachings herein. For example, additional materials, combinations of materials and/or omission of materials may be used to provide for added embodiments that are within the scope of the teachings herein.

When introducing elements of the present invention or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A pressure sensor comprising:
    an application specific integrated circuit powered by an external power supply, the external power supply providing power to a regulated power supply;
    the application specific integrated circuit including the regulated power supply, a first electrical load and a second electrical load, a stabilizing capacitor, a buffer capacitor and a diode, the diode positioned between the external power supply and the regulated power supply to ensure charge from the buffer capacitor does not enter the external power supply or the first electrical load;
    a parasitic inductor and a parasitic resistor external to the application specific integrated circuit and in series with the buffer capacitor and the stabilizing capacitor; and
    an output line from the application specific integrated circuit.

2. The pressure sensor as in claim 1, wherein the regulated voltage supply comprises a low threshold NMOS field effect transistor adapted to prevent the stored charge from flowing.

3. The pressure sensor as in claim 1, wherein the regulated voltage supply comprises a low threshold PMOS field effect transistor adapted to prevent the stored charge from flowing.

4. The pressure sensor as in claim 1, wherein the buffer capacitor is rated to maintain a voltage output that is greater than a reset voltage threshold of the circuit for at least as long as the duration of a transient event.

5. A pressure sensor comprising:
    a connection for connecting the pressure sensor to an external power supply;
    an application specific integrated circuit powered by the external power supply, the external power supply providing power to a regulated power supply;
    the application specific integrated circuit including the regulated power supply, a first electrical load and a second electrical load, a stabilizing capacitor, a buffer capacitor and a diode, the diode positioned between the external power supply and the regulated power supply to ensure charge from the buffer capacitor does not enter the external power supply or the first electrical load;
    a parasitic inductor and a parasitic resistor external to the application specific integrated circuit and in series with the buffer capacitor and the stabilizing capacitor; and
    an output line from the application specific integrated circuit.

6. The pressure sensor as in claim 5, wherein the circuit is configured with at least one switch.

7. The pressure sensor as in claim 6, wherein at least one switch comprises one of an NMOS and a PMOS field effect transistor.

8. The pressure sensor as in claim 5, wherein the pressure sensor is adapted for use in an automotive application.

* * * * *